United States Patent
Webster (10) Patent No.: US 9,275,697 B2
(45) Date of Patent: Mar. 1, 2016

(54) UTILIZING DESTRUCTIVE FEATURES AS RAM CODE FOR A STORAGE DEVICE

(71) Applicant: Western Digital Technologies, Inc., Irvine, CA (US)

(72) Inventor: Michael W. Webster, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 158 days.

(21) Appl. No.: 14/088,739

(22) Filed: Nov. 25, 2013

(65) Prior Publication Data

US 2015/0100722 A1  Apr. 9, 2015

Related U.S. Application Data

(60) Provisional application No. 61/886,604, filed on Oct. 3, 2013.

(51) Int. Cl.

| | |
|---|---|
| G06F 12/02 | (2006.01) |
| G11C 7/10 | (2006.01) |
| B62K 3/00 | (2006.01) |
| B60L 15/20 | (2006.01) |
| B60L 11/18 | (2006.01) |
| A63C 17/00 | (2006.01) |
| G06F 11/14 | (2006.01) |

(52) U.S. Cl.
CPC ............ *G11C 7/1072* (2013.01); *A63C 17/008* (2013.01); *B60L 11/18* (2013.01); *B60L 15/2036* (2013.01); *B62K 3/007* (2013.01); *G06F 11/1433* (2013.01)

(58) Field of Classification Search
CPC ............ G06F 9/44505; G06F 12/0246; G06F 3/0629; G06F 15/8771; G06F 11/1433; G11C 13/0097; G11C 13/0069; G11C 16/102; G11C 16/105

See application file for complete search history.

(56) References Cited

U.S. PATENT DOCUMENTS

| | | | |
|---|---|---|---|
| 6,499,054 | B1 | 12/2002 | Hesselink et al. |
| 6,615,355 | B2 | 9/2003 | Mattison |
| 6,615,406 | B1 | 9/2003 | Amberg et al. |
| 6,732,158 | B1 | 5/2004 | Hesselink et al. |
| 7,120,692 | B2 | 10/2006 | Hesselink et al. |

(Continued)

FOREIGN PATENT DOCUMENTS

WO      03001380 A2      1/2003

OTHER PUBLICATIONS

International Search Report and Written Opinion dated Nov. 28, 2014 from PCT/US2014/058490, filed Sep. 30, 2014, 9 pages.

*Primary Examiner* — Hiep Nguyen (57) ABSTRACT

A host including a controller configured to be connected to a storage device separate from the host. The controller is configured to maintain random access memory (RAM) code on the host, the RAM code configured to provide a destructive function, temporarily load the RAM code onto a volatile memory in the storage device during a manufacturing process, wherein the loaded RAM code, when executed by a processor in the storage device, is configured to cause the processor in the storage device to perform a destructive function on the storage device, and remove the loaded RAM code from the volatile memory after the manufacturing process, wherein the destructive function is unable to be performed by the processor when the loaded RAM code is removed from the volatile memory.

23 Claims, 5 Drawing Sheets

(56) References Cited

U.S. PATENT DOCUMENTS

| | | |
|---|---|---|
| 7,428,663 B2 | 9/2008 | Morton et al. |
| 7,454,443 B2 | 11/2008 | Ram et al. |
| 7,467,187 B2 | 12/2008 | Hesselink et al. |
| 7,546,353 B2 | 6/2009 | Hesselink et al. |
| 7,587,467 B2 | 9/2009 | Hesselink et al. |
| 7,600,036 B2 | 10/2009 | Hesselink et al. |
| 7,701,705 B1 | 4/2010 | Szeremeta |
| D621,282 S | 8/2010 | Yagi |
| 7,788,404 B2 | 8/2010 | Hesselink et al. |
| 7,917,628 B2 | 3/2011 | Hesselink et al. |
| 7,934,251 B2 | 4/2011 | Hesselink et al. |
| 7,949,564 B1 | 5/2011 | Hughes et al. |
| 8,004,791 B2 | 8/2011 | Szeremeta et al. |
| 8,064,194 B2 | 11/2011 | Szeremeta |
| 8,113,873 B1 | 2/2012 | Sarraf |
| 8,133,426 B1 | 3/2012 | Yurchenco et al. |
| 8,255,661 B2 | 8/2012 | Karr et al. |
| 8,285,965 B2 | 10/2012 | Karr et al. |
| 8,341,117 B2 | 12/2012 | Ram et al. |
| 8,341,275 B1 | 12/2012 | Hesselink et al. |
| 8,352,567 B2 | 1/2013 | Hesselink et al. |
| 8,358,395 B1 | 1/2013 | Szeremeta |
| 8,417,979 B2 | 4/2013 | Maroney |
| 8,429,336 B2 | 4/2013 | Aida |
| 8,462,460 B1 | 6/2013 | Szeremeta et al. |
| 8,498,088 B1 | 7/2013 | Klein |
| 8,526,798 B2 | 9/2013 | Hesselink |
| 8,547,658 B1 | 10/2013 | Szeremeta |
| 8,631,284 B2 | 1/2014 | Stevens |
| 8,646,054 B1 | 2/2014 | Karr et al. |
| 8,661,507 B1 | 2/2014 | Hesselink et al. |
| 8,688,797 B2 | 4/2014 | Hesselink et al. |
| 8,713,265 B1 | 4/2014 | Rutledge |
| D707,667 S | 6/2014 | Kono et al. |
| 8,762,682 B1 | 6/2014 | Stevens |
| 8,780,004 B1 | 7/2014 | Chin |
| 8,793,374 B2 | 7/2014 | Hesselink et al. |
| 8,819,443 B2 | 8/2014 | Lin |
| 2002/0199152 A1 | 12/2002 | Garney et al. |
| 2003/0177377 A1 | 9/2003 | Safa |
| 2005/0138645 A1* | 6/2005 | Lu .................. 719/321 |
| 2005/0144195 A1 | 6/2005 | Hesselink et al. |
| 2005/0144200 A1 | 6/2005 | Hesselink et al. |
| 2006/0187080 A1* | 8/2006 | Slatter ............ 340/825.22 |
| 2008/0126788 A1* | 5/2008 | Kreek et al. .......... 713/100 |
| 2010/0082932 A1 | 4/2010 | Rothman et al. |
| 2012/0036041 A1 | 2/2012 | Hesselink |
| 2012/0265921 A1* | 10/2012 | Post et al. ............ 711/103 |
| 2013/0013907 A1 | 1/2013 | Marino et al. |
| 2013/0212401 A1 | 8/2013 | Lin |
| 2013/0266137 A1 | 10/2013 | Blankenbeckler et al. |
| 2013/0268749 A1 | 10/2013 | Blankenbeckler et al. |
| 2013/0268759 A1 | 10/2013 | Blankenbeckler et al. |
| 2013/0268771 A1 | 10/2013 | Blankenbeckler et al. |
| 2014/0095439 A1 | 4/2014 | Ram |
| 2014/0169921 A1 | 6/2014 | Carey |
| 2014/0173215 A1 | 6/2014 | Lin et al. |

* cited by examiner

UTILIZING DESTRUCTIVE FEATURES AS RAM CODE FOR A STORAGE DEVICE

CROSS-REFERENCE TO RELATED APPLICATIONS

This application claims the benefit of U.S. Provisional Application No. 61/886,604, filed on Oct. 3, 2013, entitled "UTILIZING DESTRUCTIVE FEATURES AS RAM CODE FOR A STORAGE DEVICE," which is hereby incorporated by reference in its entirety.

BACKGROUND

Conventionally, a storage device may store a variety of programs. Some of the programs may be beneficial for the user or a manufacturer. However, even if a program is beneficial for the user or the manufacturer, the program may have destructive features. That is, the program may have the ability to render the storage device inoperable, even when the user does not intend to render the storage device inoperable. In such a case, the storage device may need to be sent in for repairs. This can be costly and time consuming for the user. Furthermore, this can also increase manufacturing and repair costs for the storage device if the storage device is under warranty.

However, non-use of the program may increase manufacturing costs since the program may have beneficial qualities during manufacture or design of the storage device.

BRIEF DESCRIPTION OF THE DRAWINGS

The features and advantages of the present embodiments will become more apparent from the detailed description set forth below when taken in conjunction with the drawings, wherein.

DETAILED DESCRIPTION

Figure 1:
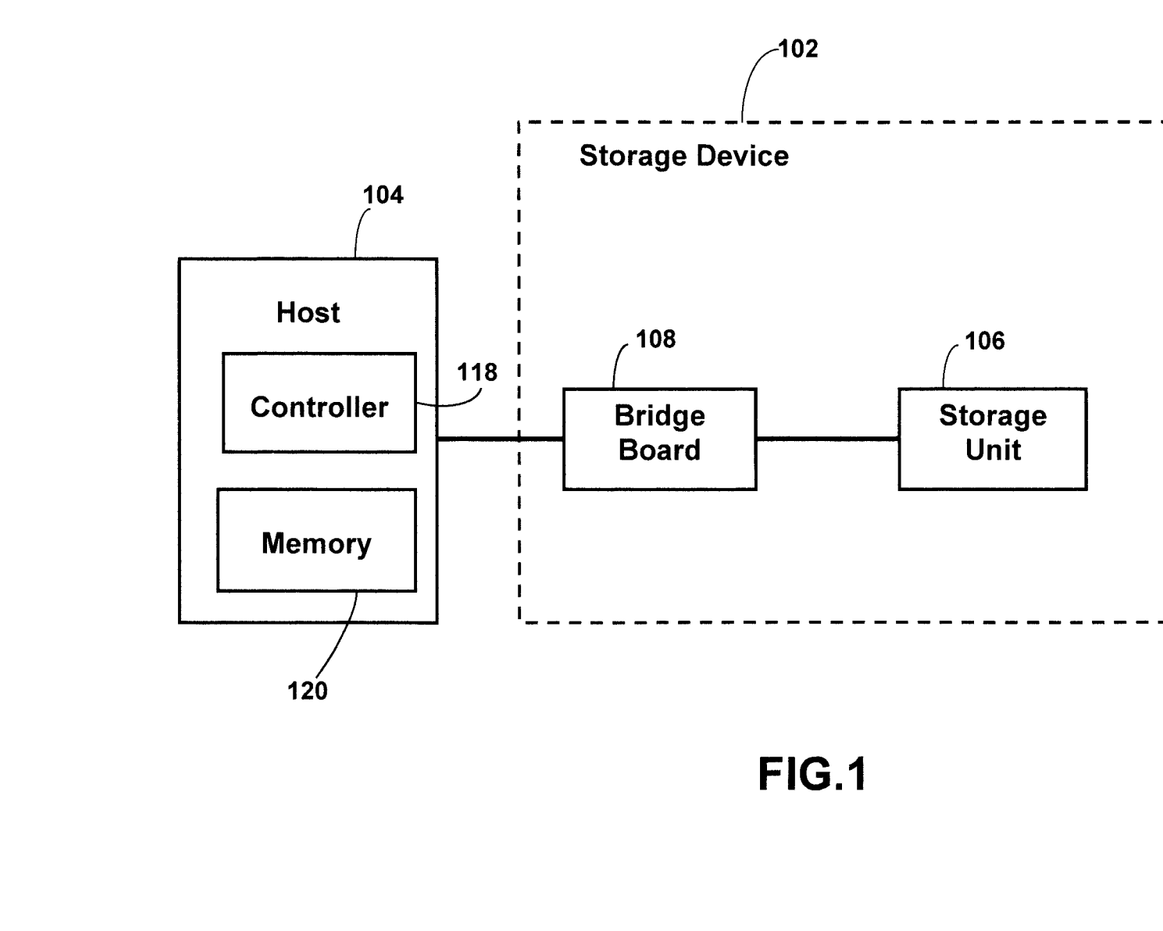
FIG. 1 depicts a host connected to a storage device according to an embodiment.

In an embodiment, as shown in FIG. 1, a storage device 102 is connected to a host 104. In an embodiment, the host 104 comprises an external host separate from the storage device 102. In an embodiment, the storage device 102 can comprise a network attached storage (NAS) device, or a direct attached storage (DAS) device. In an embodiment, the storage device 102 can comprise a bridge board 108 and a storage unit 106. In an embodiment, the host 104 is configured to be connected to the storage device 102 using the bridge board 108. In an embodiment, the storage unit 106 comprises a hard disk drive or a solid state drive. In an embodiment, the hard disk drive comprises a magnetic rotating disk. In an embodiment, the solid state drive comprises a solid state memory.

While the description herein refers to solid state memory generally, it is understood that solid state memory may comprise one or more of various types of solid state non-volatile memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

In an embodiment the host 104 comprises a controller 118 and a memory 120, which will be described in more detail below. In an embodiment, the memory 120 may comprise a volatile memory, a non-volatile memory, or any combination thereof. The memory 120 may be configured to store code, data, or programs which the controller 118 may wish to utilize. In an embodiment, the memory 120 is accessible by the controller 118.

Although the memory 120 is located in the host 104 in the embodiment shown in FIG. 1, the memory 120 could be located externally from the host 104 so long as the memory 120 is accessible by the host 104, but inaccessible by the storage device 102, or which has limited accessibility by the storage device 102. That is, the storage device 102 will be unable to access the memory 120 after the storage device 102 leaves a manufacturing facility or a repair facility.

In an embodiment, the host 104 comprises a computer, a testing machine, or other device which can be used to configure the storage device 102. In an embodiment, the host 104 is configured to be connected to the bridge board 108 using a small computer system interface (SCSI). However, in an embodiment, the host 104 may utilize other types of interfaces to connect to the storage device 102.

In an embodiment, the bridge board 108 is configured to be connected to the storage unit 106 using a serial advanced technology attachment (SATA) interface. However, in an embodiment, the bridge board 108 may be configured to be connected to the storage unit 106 using other types of interfaces.

Figure 2:
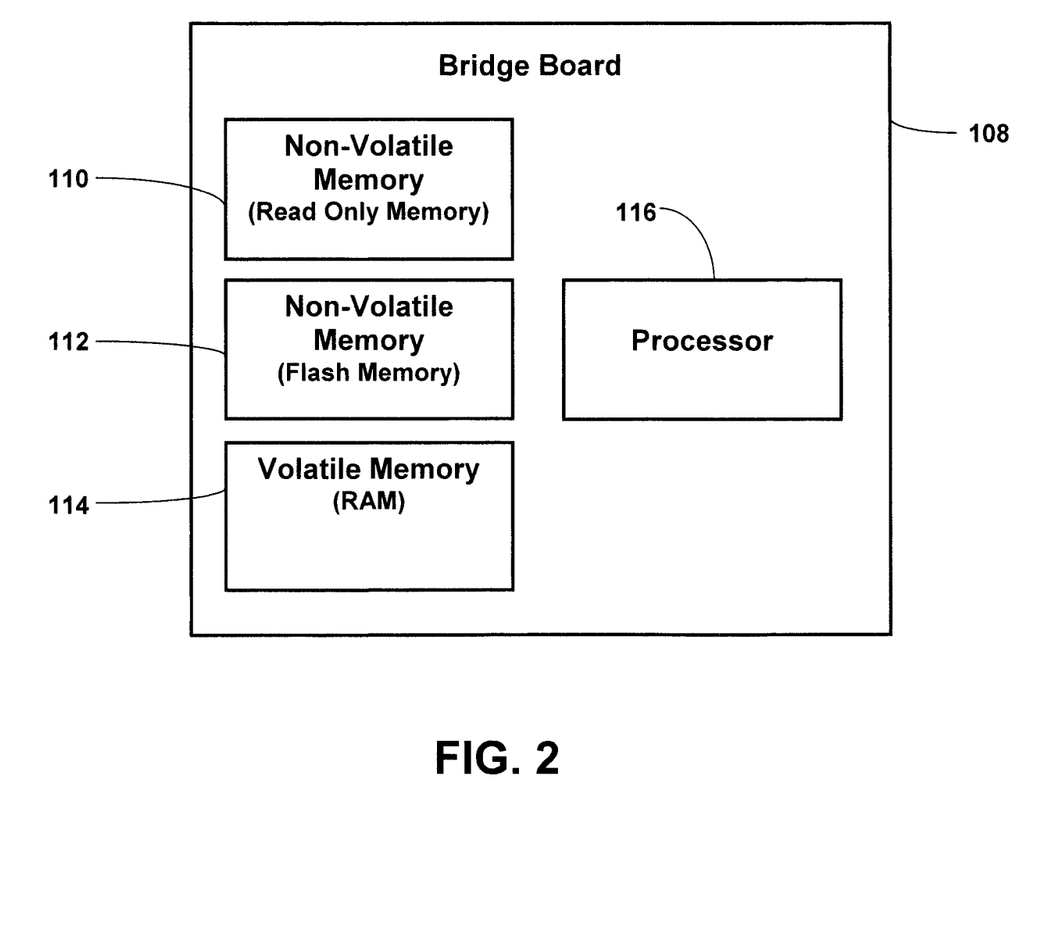
FIG. 2 depicts a bridge board in a storage device according to an embodiment.

In an embodiment, the bridge board 108 is shown in FIG. 2. In the embodiment shown in FIG. 2, the bridge board 108 comprises a non-volatile memory 110, such as a read only memory (ROM), a non-volatile memory 112, such as a flash memory, a volatile memory 114, such as a random access memory (RAM), and a processor 116. In an embodiment, the processor 116 can comprise a microprocessor.

In an embodiment, the non-volatile memory 110 (ROM) can store a program such as a ROM program which can be loaded when the storage device 102 is boot up and executed by the processor 116. In an embodiment, the ROM program comprises an initial program. In an embodiment, the non-volatile memory 112 (flash memory) can be configured to store firmware as shown in an embodiment in FIG. 3

Figure 3:
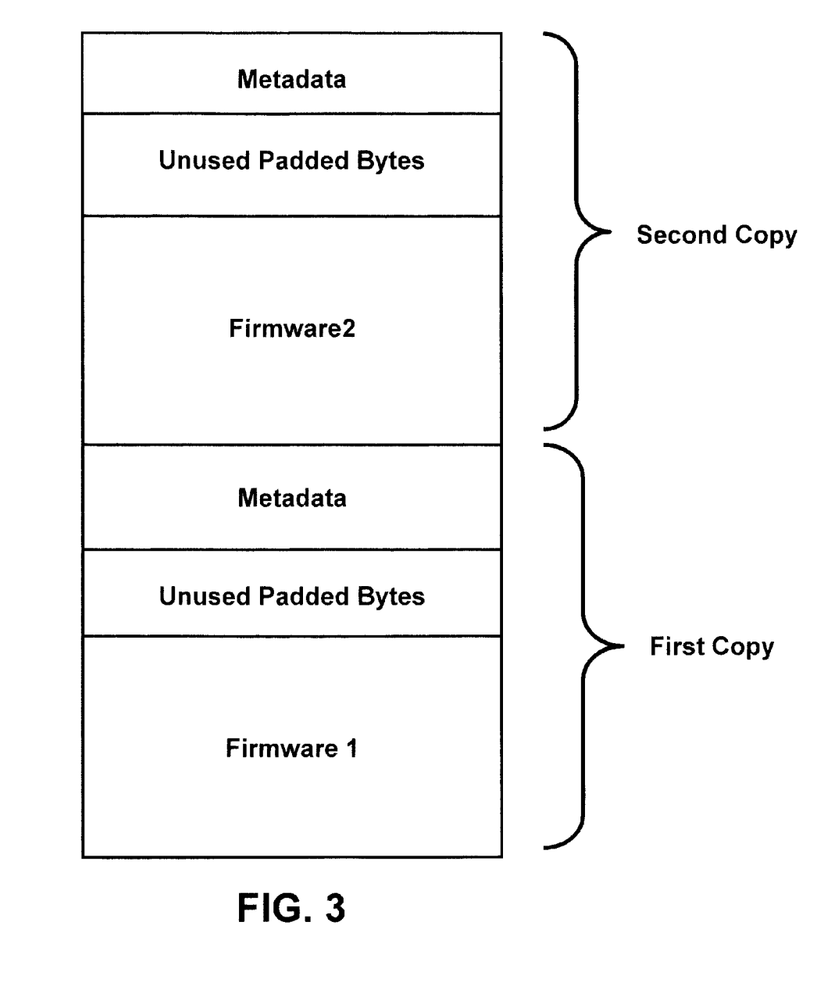
FIG. 3 depicts contents of non-volatile memory in a storage device according to an embodiment.

In the embodiment shown in FIG. 3, the non-volatile memory 112 (flash memory) is configured to store multiple copies of the firmware such as a first copy of the firmware and a second copy of the firmware. The multiple copies of the firmware can provide a safeguard against failure by providing redundancy for the firmware. Thus, if a first copy of the firmware becomes corrupted or damaged, the second copy of the firmware can be used instead. Similarly, if a second copy of the firmware becomes corrupted or damaged, the first copy of the firmware can be used instead.

Furthermore, the non-volatile memory 112 (flash memory) can also store one or more copies of metadata. The metadata can provide useful information regarding each copy of the firmware such as version information, most recently written copy of the firmware, and cyclic redundancy check ("CRC") information of the firmware. In an embodiment, removal of all of the copies of the firmware or all of the copies of the metadata may render the storage device 102 inoperable.

In an embodiment, when the ROM program is executed by the processor 116, the firmware stored in the non-volatile memory 112 (flash memory) can be loaded onto the volatile memory 114 (RAM) for execution by the processor 116.

Figure 4:
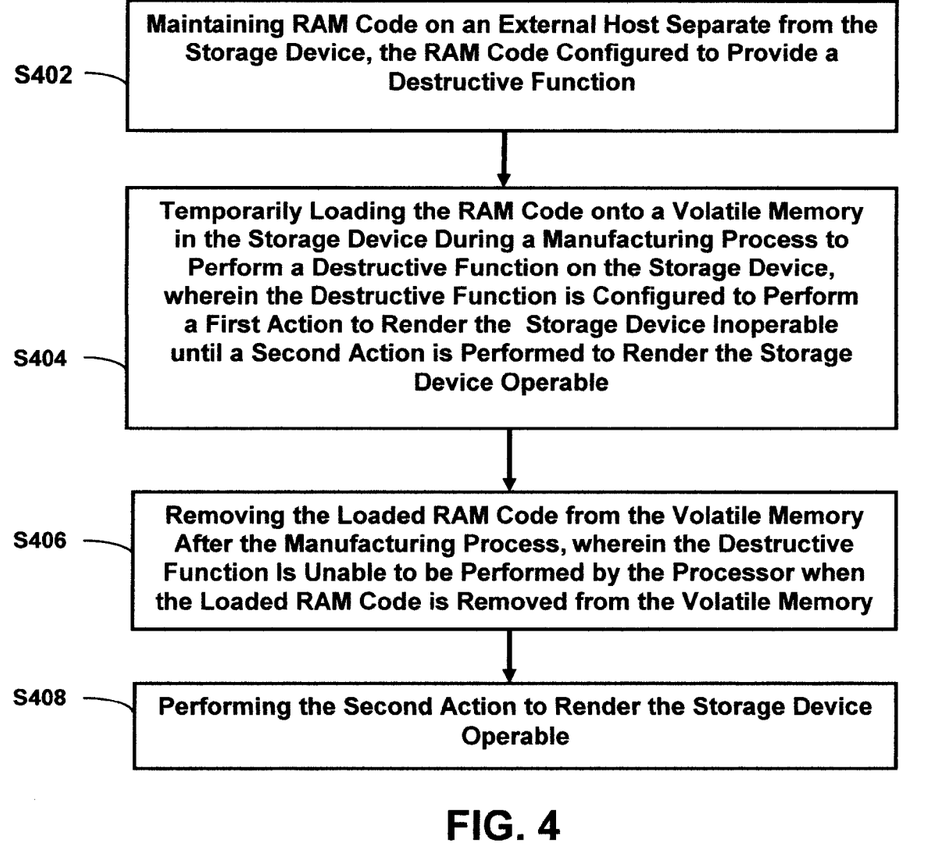
FIG. 4 depicts a process for configuring a storage device according to an embodiment.

In an embodiment, a process for configuring the storage device 102 is shown in FIG. 4. In block S402, the controller 118 of the host 104 maintains the RAM code on the host 104, which is separate from the storage device. As previously noted, the RAM code can be configured to provide a destructive function.

In block S404, the controller 118 of the host 104 can temporarily load the RAM code onto the volatile memory 114 (RAM) during a manufacturing process. For example, the controller 118 in the host 104 can be configured to load the RAM code onto the volatile memory 114 (RAM). Furthermore, the loaded RAM code, when executed by the processor 116, is configured to cause the processor 116 to perform a destructive function on the storage device 102. In an embodiment, the destructive function is configured to perform a first action to render the storage device 102 inoperable until a second action is performed to render the storage device 102 operable.

In an embodiment, the destructive function can be performed on data stored in a memory in the storage device 102. In an embodiment, the memory comprises the non-volatile memory 112 (flash memory).

For example, the destructive function can comprise a complete erase of the data stored in the non-volatile memory 112 (flash memory). Thus, the firmware, including all copies of the firmware may be erased. Without the firmware stored in the non-volatile memory 112 (flash memory), the storage device may be inoperable since no firmware is available to be loaded onto the volatile memory 114 (RAM) for execution by the processor. Furthermore, the metadata for each of the firmware may be erased. In addition, without the metadata, the storage device 102 may be unable to determine relevant information regarding the firmware or even determine if the firmware is valid or not. Thus, in an embodiment, when the storage device 102 is inoperable, the storage device 102 may be unable to complete its boot process when booting up.

In block S406, the controller 118 can remove the loaded RAM code from the volatile memory 114 (RAM) after the manufacturing process, wherein the destructive function is unable to be performed by the processor 116 when the loaded RAM code is removed from the volatile memory 114 (RAM). In an embodiment, the loaded RAM code can be removed from the volatile memory 114 (RAM) in the storage device 102 by powering off the storage device 102. In such a case, the loaded RAM code will be removed since the volatile memory 114 (RAM) will lose data stored in its memory when power is lost.

In an embodiment, the controller 118 in the host 104 can send a signal to the storage device 102 to power off. In an embodiment, the controller 118 in the host 104 can prevent power from being supplied to the storage device 102 in order to power off the storage device 102.

In an embodiment, the loaded RAM code can be removed from the volatile memory 114 (RAM) in the storage device 102 through commands issued from the controller 118 in the host 104. For example, in an embodiment, the controller 118 in the host 104 can instruct the processor 116 in the storage device 102 to erase the loaded RAM code from the volatile memory 114 (RAM) or replace the loaded RAM code with replacement data or other data. In an embodiment, the replacement data could be a new copy of the firmware and/or the metadata.

In block S408, the controller 118 can perform the second action to render the storage device 102 operable. In an embodiment, the second action comprises loading the replacement data onto the non-volatile memory 112 (flash memory). For example, the controller 118 can be configured to load the replacement data onto the non-volatile memory 112 (flash memory) to render the storage device 102 operable again. In an embodiment, the replacement data can comprise a copy of the firmware which was erased, a correct or functional copy of the firmware, a new version of the firmware, corresponding metadata for the firmware, or additional data which should be loaded onto the non-volatile memory 112 (flash memory) and which will render the storage device 102 operable again.

Figure 5:
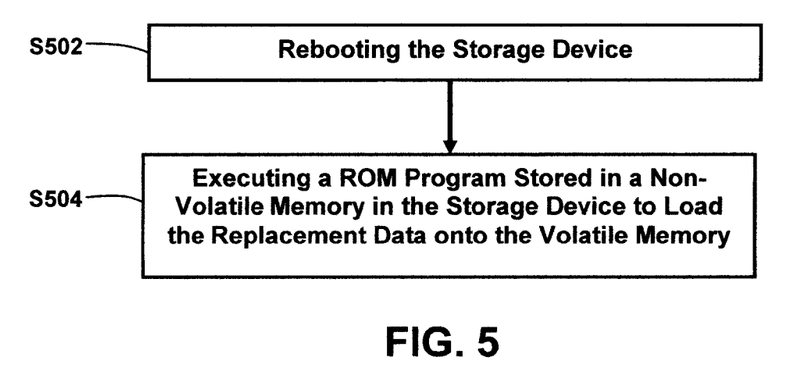
FIG. 5 depicts a process for loading replacement data onto a volatile memory in a storage device is according to an embodiment.

In an embodiment, an optional or additional process for loading replacement data onto the volatile memory 114 (RAM) is shown in FIG. 5. In block S502, the controller 118 in the host 104 instructs the storage device 102 to reboot. In an embodiment, when the storage device 102 reboots, the processor 116 executes a ROM program stored in the non-volatile memory 110 (ROM). In an embodiment, the ROM program causes the processor 116 to load replacement data from the non-volatile memory 112 (flash memory) onto the volatile memory 114 (RAM). For example, the ROM program can cause the processor 116 to load the firmware stored in the non-volatile memory 112 (flash memory) onto the volatile memory 114 (RAM). In an embodiment, this replaces the loaded RAM code in the volatile memory 114 (RAM) with the replacement data. Thus, the loaded RAM code in the volatile memory 114 (RAM) may be replaced with the firmware.

In an embodiment, the destructive function is unable to be performed by the processor 116 when the loaded RAM code is removed from the volatile memory 114 (RAM). This can be beneficial because it can prevent a user from causing the processor 116 to execute the loaded RAM code to utilize the destructive function. As previously noted, usage of the destructive function may render the storage device 102 inoperable, which may require the user to send the storage device 102 in for repair.

However, in an embodiment, the destructive function may be beneficial during configuration of the storage device 102 such as during manufacturing or development of the storage device 102. For example, during manufacturing, the non-volatile memory 112 (flash memory) may comprise corrupted firmware. To ensure that a correct or functional copy of the firmware is loaded onto the non-volatile memory 112 (flash memory), the destructive function may be used on the non-volatile memory 112 (flash memory) to erase all data stored in the non-volatile memory 112 (flash memory). In an embodiment, this can ensure that the non-volatile memory 112 (flash memory) is completely wiped clean prior to loading the correct or functional copy of the firmware.

In an embodiment, this can help reclaim and reuse storage devices 102 which may have had a corrupted firmware in the non-volatile memory 112 (flash memory). In an embodiment, this can reduce manufacturing costs since the storage device 102 or portions thereof need not be wasted. Furthermore, should the non-volatile memory 112 (flash memory) still contain corrupted firmware, the non-volatile memory 112 (flash memory) can be more readily identified as a problem instead of the firmware. This can also reduce manufacturing costs by reducing troubleshooting costs.

Similarly, during development, it may be beneficial to ensure that a new version of a firmware is loaded and utilized instead of an old version of the firmware. Thus, the destructive function may be utilized to erase all data in the non-volatile memory 112 (flash memory) and ensure that the non-volatile memory 112 (flash memory) does not contain a copy of the old version of the firmware prior to loading of the new version of the firmware.

In an embodiment, the removal of the RAM code and the lack of access to the RAM code by the user will not prevent the user from upgrading the firmware. To upgrade the firmware, the new version of the firmware will be overlaid over the old version of the firmware. For example, a copy of the old version of the firmware can be maintained in the non-volatile memory 112 (flash memory) along with a copy of the new version of the firmware. Thus, if the new version of the firmware presents installation problems, such as if the new version of the firmware is corrupted or is not compatible with the storage device 102, then the old version of the firmware can be restored.

In an embodiment, by using the RAM code to perform the destructive function instead of other persistent code, the ability of the user to utilize the destructive function can be limited since the user will have limited or no access to the RAM code. However, the ability of the manufacturer to utilize the destructive function during configuration of the storage device 102 can be maintained since the manufacturer will have access to the RAM code.

In an embodiment, the memory 120 in the host 104 is configured to store an original RAM code, while the RAM code which is loaded onto the volatile memory 114 (RAM) in the storage device 102 comprises a removable copy of the original RAM code. In an embodiment, a copy of the RAM code is not stored in any non-volatile memory in the storage device 102. In an embodiment, this can ensure that any copies of the RAM code will be erased from the storage device 102 prior to access by the user since the storage device 102 may be powered down prior to access by the user. In an embodiment this can further reduce the likelihood that the user will have access to the RAM code. In an embodiment, the original RAM code can comprise a permanent copy of the RAM code.

Figure 6:
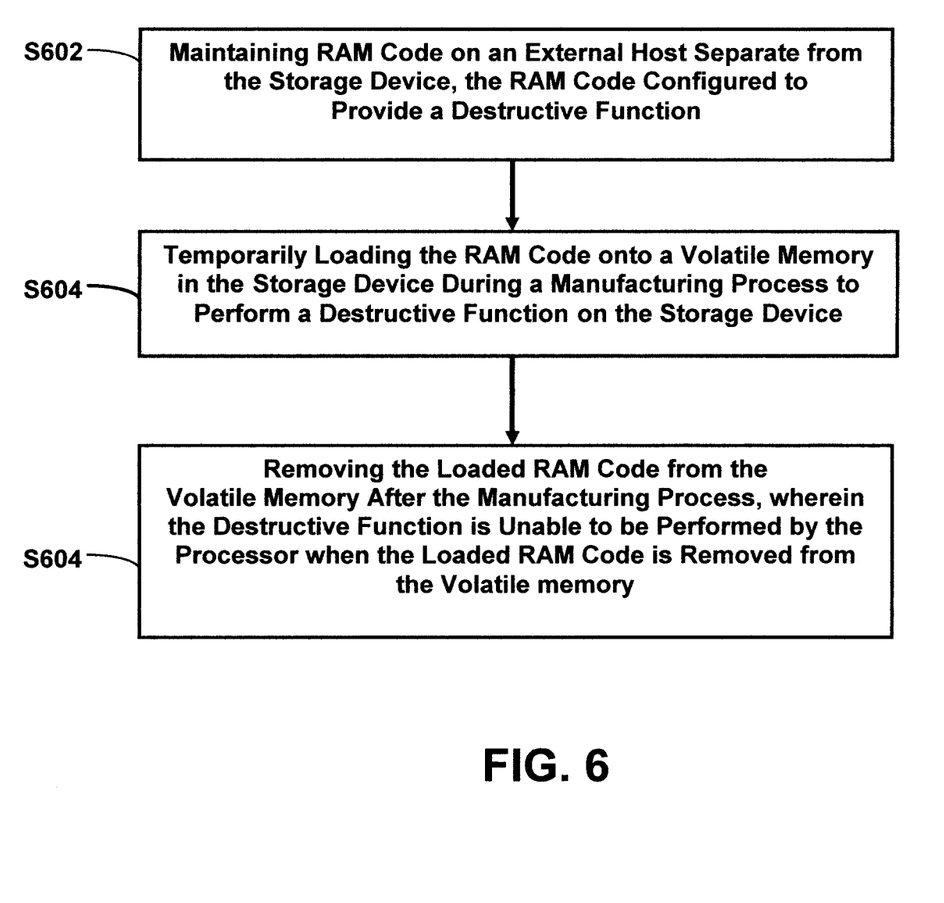
FIG. 6 depicts a process for configuring a storage device according to an embodiment.

In an embodiment, a process for configuring a storage device 102 is shown in FIG. 6. In an embodiment, the destructive function can comprise other functions which may be harmful to the storage device 102, but which may be useful during configuration of the storage device 102. In the embodiment shown in FIG. 6, the destructive function need not perform a first action to render the storage device 102 inoperable until a second action is performed to render the storage device 102 operable.

In block S602, the controller 118 of the host 104 maintains the RAM code on the host 104. The RAM code can be configured to provide a destructive function. In an embodiment, this can be similar or the same as the block S402 in the embodiment shown in FIG. 4. In block S604, the controller 118 of the host 104 can temporarily load the RAM code onto the volatile memory 114 (RAM) during a manufacturing process. For example, the controller 118 in the host 104 can be configured to load the RAM code onto the volatile memory 114 (RAM). Furthermore, the loaded RAM code, when executed by the processor 116, is configured to cause the processor 116 to perform a destructive function on the storage device 102.

For example, the destructive function may comprise a function for setting heat removal operations for the storage device 102. In an embodiment, the heat removal operations comprise thermal controls such as the operational speed of fans in the storage device 102. In an embodiment, this may be destructive because it may damage the storage device 102 if it is improperly set. However, this destructive function may be useful since the operational speed of the fans in the storage device 102 may need to be configured.

Furthermore, in an embodiment, the destructive functions could enable certain performance characteristic improvements in the storage device 102 which may be dangerous to the data stored in the storage device 102. For example, when the storage unit 106 comprises a disk drive, the destructive function could comprise enabling delayed cache writes to a disk in the disk drive. In an embodiment, this could be dangerous to data integrity in the disk drive.

In block S606, the controller 118 can remove the loaded RAM code from the volatile memory 114 (RAM) after the manufacturing process, wherein the destructive function is unable to be performed by the processor 116 when the loaded RAM code is removed from the volatile memory 114 (RAM). In an embodiment, this can be similar or the same as the block S406 in the embodiment shown in FIG. 4.

Those of ordinary skill would appreciate that the various illustrative logical blocks, modules, and algorithm parts described in connection with the examples disclosed herein may be implemented as electronic hardware, computer software, or combinations of both. Furthermore, the embodiments can also be embodied on a non-transitory machine readable medium causing a processor or computer to perform or execute certain functions.

To clearly illustrate this interchangeability of hardware and software, various illustrative components, blocks, modules, circuits, and process parts have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The parts of a method or algorithm described in connection with the examples disclosed herein may be embodied directly in hardware, in a software module executed by a processor, or in a combination of the two. The parts of the method or algorithm may also be performed in an alternate order from those provided in the examples. A software module may reside in RAM memory, flash memory, ROM memory, EPROM memory, EEPROM memory, registers, hard disk, a removable disk, an optical disk, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC).

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the disclosure is, therefore, indicated by the appended claims rather than by the foregoing description. All changes which come within the meaning and range of equivalency of the claims are to be embraced within their scope.

What is claimed is:

1. A host computing device comprising:
a controller configured to be connected to a data storage device separate from the host computing device and to:
maintain random access memory (RAM) code on the host device, the RAM code including instructions for performing a destructive function on the data storage device;
temporarily load the RAM code onto a volatile memory of the data storage device during a manufacturing process, wherein the loaded RAM code, when executed by one or more processors of the data storage device, directs the one or more processors to perform the destructive function by completely erasing a non-volatile memory of the data storage device containing firmware for operation of the data storage device; and
remove the loaded RAM code from the volatile memory of the data storage device, wherein the destructive function is unable to be performed by the data storage device when the loaded RAM code is removed from the volatile memory.

2. The host computing device of claim 1 wherein the destructive function involves a first action that renders the data storage device inoperable until a second action is performed to render the data storage device operable.

3. The host computing device of claim 2 wherein the controller is further configured perform the second action to render the data storage device operable, wherein the second action comprises loading replacement data onto the non-volatile memory of the data storage device.

4. The host computing device of claim 3 wherein the non-volatile memory of the data storage device comprises flash memory.

5. The host computing device of claim 4 wherein the replacement data comprises a new copy of the firmware.

6. The host computing device of claim 5 wherein said removing the loaded RAM code from the volatile memory further comprises rebooting the data storage device.

7. The host computing device of claim 1 wherein the destructive function is configured to improve performance characteristics of a storage unit in the data storage device.

8. The host computing device of claim 1 wherein the destructive function further involves setting heat removal operations for the data storage device.

9. The host computing device of claim 1 further comprising a memory configured to store an original RAM code, wherein the loaded RAM code comprises a removable copy of the original RAM code.

10. A method for manufacturing a data storage device comprising:
maintaining random access memory (RAM) code on an external host device separate from the data storage device, the RAM code including instructions for performing a destructive function on the data storage device;
temporarily loading the RAM code from the external host device onto a volatile memory of the data storage device during a manufacturing process, wherein the loaded RAM code, when executed by one or more processors of the data storage device, directs the one or more processors to perform the destructive function by completely erasing a non-volatile memory of the data storage device containing firmware for operation of the data storage device; and
removing the loaded RAM code from the volatile memory of the data storage device, wherein the destructive function is unable to be performed by the data storage device when the loaded RAM code is removed from the volatile memory.

11. The method of claim 10 wherein the destructive function involves a first action that renders the data storage device inoperable until a second action is performed to render the data storage device operable.

12. The method of claim 11 further comprising performing the second action to render the data storage device operable, wherein the second action comprises loading replacement data onto the non-volatile memory of the data storage device.

13. The method of claim 12 wherein the non-volatile memory of the data storage device comprises flash memory.

14. The method of claim 13 wherein the replacement data comprises a new copy of the firmware.

15. The method of claim 14 wherein the removing the loaded RAM code from the volatile memory further comprises loading the new copy of the firmware onto the volatile memory.

16. The method of claim 14 wherein the removing the loaded RAM code from the volatile memory further comprises rebooting the data storage device.

17. The method of claim 13 further comprising:
rebooting the data storage device; and
executing a read only memory (ROM) program stored in a non-volatile boot memory of the data storage device using the one or more processors when the data storage device is rebooted, wherein the ROM program causes the one or more processors to load the replacement data onto the volatile memory.

18. The method of claim 10 wherein the destructive function is configured to improve performance characteristics of a storage unit of the data storage device.

19. The method of claim 10 wherein the destructive function further involves setting heat removal operations for the data storage device.

20. The method of claim 10 further comprising storing an original RAM code in a memory of the external host, wherein the loaded RAM code comprises a removable copy of the original RAM code.

21. A non-transitory machine readable medium storing a program which when executed by one or more processors of a host device, causes the one or more processors of the host device to configure a data storage device that is separate from the host device by:
maintaining random access memory (RAM) code on the host device, the RAM code including instructions for performing a destructive function on the data storage device;
temporarily loading the RAM code from the host device onto a volatile memory of the data storage device, wherein the loaded RAM code, when executed by one or more processors of the data storage device, directs the one or more processors of the data storage device to perform the destructive function by completely erasing a non-volatile memory of the data storage device containing firmware for operation of the data storage device; and
removing the loaded RAM code from the volatile memory of the data storage device, wherein the destructive function is unable to be performed by the data storage device when the loaded RAM code is removed from the volatile memory.

22. The non-transitory machine readable medium of claim 21 wherein the destructive function involves a first action that renders the data storage device inoperable until a second action is performed to render the storage device operable.

23. The non-transitory machine readable medium of claim 22 wherein the program further causes the one or more processors of the host device to further configure the data storage device by performing the second action to render the storage device operable, wherein the second action comprises loading replacement data onto the volatile memory of the storage device.

* * * * *